US007170393B2

(12) United States Patent
Martin

(10) Patent No.: US 7,170,393 B2
(45) Date of Patent: *Jan. 30, 2007

(54) METHOD AND APPARATUS FOR THE AUTOMATIC DETERMINATION OF NETWORK CABLE CONNECTIONS USING RFID TAGS AND AN ANTENNA GRID

(75) Inventor: Clifford E Martin, Martinsville, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 196 days.

This patent is subject to a terminal disclaimer.

(21) Appl. No.: 10/812,598

(22) Filed: Mar. 30, 2004

(65) Prior Publication Data

US 2005/0219050 A1    Oct. 6, 2005

(51) Int. Cl.
*H04Q 5/22* (2006.01)
*G06F 19/00* (2006.01)
*G06K 7/00* (2006.01)

(52) U.S. Cl. .................. 340/10.1; 700/115; 235/440
(58) Field of Classification Search ............ 340/10.31, 340/10.32, 10.52, 568.1, 568.2, 572.6, 10.1, 340/2, 10.42; 235/375, 435, 487; 343/853, 343/893; 375/133; 700/115, 116; 342/374, 342/45; 333/258, 262
See application file for complete search history.

(56) References Cited

U.S. PATENT DOCUMENTS 5,729,236 A * 3/1998 Flaxl .......................... 342/374
5,784,686 A    7/1998 Wu ............................. 455/45
5,910,776 A * 6/1999 Black ......................... 340/10.1
5,952,922 A    9/1999 Shober ...................... 340/572.4
6,084,530 A    7/2000 Pidwerbetsky ......... 340/825.54
6,130,623 A   10/2000 MacLellan ............. 340/825.54
6,184,841 B1   2/2001 Shober ........................ 343/853
6,243,012 B1   6/2001 Shober ...................... 340/572.7
6,847,856 B1 * 1/2005 Bohannon ................... 700/115
6,968,994 B1 * 11/2005 Ashwood Smith .......... 235/375

* cited by examiner

*Primary Examiner*—Wendy R. Garber
*Assistant Examiner*—William Bangachon
(74) *Attorney, Agent, or Firm*—Kenneth M. Brown

(57) ABSTRACT

Radio Frequency Identification (RFID) tags and an antenna grid are used for automatic determination of cable connections. An RF antenna grid is advantageously employed on a device having a plurality of device ports (e.g., cable connection points) which may, for example, be physically organized in a two-dimensional arrangement. Then, when RFID tags are fixed to one or more cable ends, it can advantageously be determined which of the one or more cables are connected to which of the ports on the device. The RF antenna grid may comprise a plurality of individual antennas which are advantageously multiplexed such that a single RFID reader can handle the sensing for all antennas. Also, opposing ends of a given cable may be advantageously provided with RFID tags having related ID codes such that connections which exist between two connected ports of the device may be easily and efficiently determined.

21 Claims, 2 Drawing Sheets

METHOD AND APPARATUS FOR THE AUTOMATIC DETERMINATION OF NETWORK CABLE CONNECTIONS USING RFID TAGS AND AN ANTENNA GRID

FIELD OF THE INVENTION

The present invention relates generally to the field of Radio Frequency Identification (RFID) systems and more particularly to the use of RFID techniques for the automatic determination of network cable connections.

BACKGROUND OF THE INVENTION

The management of complicated networks such as telecommunications networks or sophisticated computer networks is tremendously expensive. A substantial portion of this cost arises from incomplete, incorrect or ambiguous knowledge about a network. For example, a telecommunications network operator may not have an accurate record of how network switches are configured, leading to failed attempts to fix problems or provision new services. This lack of knowledge can in some instances be remedied by polling the networking equipment to determine its actual settings.

However, a more fundamental ambiguity arises at the physical level of network cable management. Network cables may be added, removed or moved by support personnel for a variety of reasons, often to solve urgent problems. However, it is very difficult to maintain an accurate record of exactly which cable is connected to which port of a given piece of equipment (e.g., a patch panel of a telecommunications switch), since the cables may so easily be connected, disconnected, and reconnected.

Typically, network cable locations and connections are tracked manually, by, for example, putting printed tags on each cable, storing the tag-to-cable mappings in a database, and then attempting to manually keep the database up to date. In addition, physical inventories of network offices, in which the cables are identified, tagged and mapped, are themselves typically performed manually. In a large telecommunications or computer network system, it is an extremely expensive proposition to keep track of every cable, where it is, where it runs, and which port on a given piece of equipment it is plugged into. As a result, equipment inventory databases are notoriously inaccurate, and the negative results include, inter alia, loss of network capacity, increased service times and a much greater chance of disruptive service errors. Thus, it would be highly advantageous if there were an automated mechanism able to identify the connections between cables and equipment ports of a given piece of equipment such as, for example, a patch panel of a telecommunications switch.

SUMMARY OF THE INVENTION

The present inventor has recognized that Radio Frequency Identification (RFID) systems using RF antenna grids can be advantageously employed to provide an efficient framework for the automatic determination of network cable connections. As is well known to those skilled in the art, RFID technology allows an object bearing an RFID tag to be located in physical space—for example, it is well known that it can easily be determined that an object bearing an RFID tag is at least "near" an RFID sensing device (i.e., an RF antenna). This is clearly quite useful in a number of common prior art applications of this technology, such as inventory management in retail and wholesale applications, automatic toll collection, tracking of vehicles, etc.

One approach to the use of Radio Frequency Identification (RFID) systems for the automatic determination of cable connections employs RFID tags on both cable ends and equipment ports, determines each of their respective locations (with use of one or more RFID sensing devices), and then determines the physical proximity therebetween. Based on this determined physical proximity, juxtaposition (e.g., a connection) between the cable and the port can be determined. This approach is described in detail in co-pending U.S. patent application Ser. No. 10/651,740, "Method For Determining Juxtaposition Of Physical Components With Use of RFID Tags", filed by Philip L. Bohannon on Aug. 29, 2003 and commonly assigned to the assignee of the present invention.

Another approach to the use of Radio Frequency Identification (RFID) systems for the automatic determination of cable connections might comprise the use of RFID tags on each cable end and a single, independent receiver (e.g., antenna) at (or near to) each device port. Then, the specific cable end that is connected to each device port (if any) can be advantageously determined by merely reading the ID value of the connected cable end. This, however, might be prohibitively expensive. (As is familiar to those of ordinary skill in the art, whereas RFID tags are extremely inexpensive, RFID readers are typically not so inexpensive.)

In accordance with the principles of the present invention, however, an RF antenna grid is advantageously employed on a device having a plurality of device ports (e.g., cable end connection points), which may, for example, be physically organized in a two-dimensional arrangement. (As used herein, a "device port" is any physical receptacle into which an end of a cable may be connected. The receptacle and cable may, for example, be adapted to carry electrical or optical signals, but they are not necessarily limited thereto. Also as used herein, the term "antenna grid" is not meant to imply any particular arrangement of antennas or device ports to which it is employed, but rather represents any antenna arrangement in which either multiple device ports are associated with a given RFID antenna and/or in which two or more distinct antennas are associated with a given device port.) In particular, each of the RFID antennas is advantageously located on the device such that it is in close physical proximity to each of two or more device ports. (As used herein, the term "close physical proximity" between an RFID antenna and a device port is defined by the ability of the RFID antenna to sense the presence of an RFID tag attached to a cable end which has been plugged into the device port when directed to do so by an RFID reader.)

Thus, according to the principles of the present invention, when RFID tags have been fixed to one or more cable ends, it can advantageously be determined which of the one or more cables are connected to which of the ports on the device. In accordance with one illustrative embodiment of the present invention, the RF antenna grid comprises a plurality of individual antennas which are advantageously multiplexed such that a single RFID reader can handle the sensing for all antennas. Also, in accordance with one illustrative embodiment of the present invention, the opposing ends of a given cable are advantageously provided with RFID tags having related ID codes such that connections which exist between two connected ports of the device may be easily and efficiently determined.

DETAILED DESCRIPTION OF THE PREFERRED EMBODIMENTS

Figure 1:
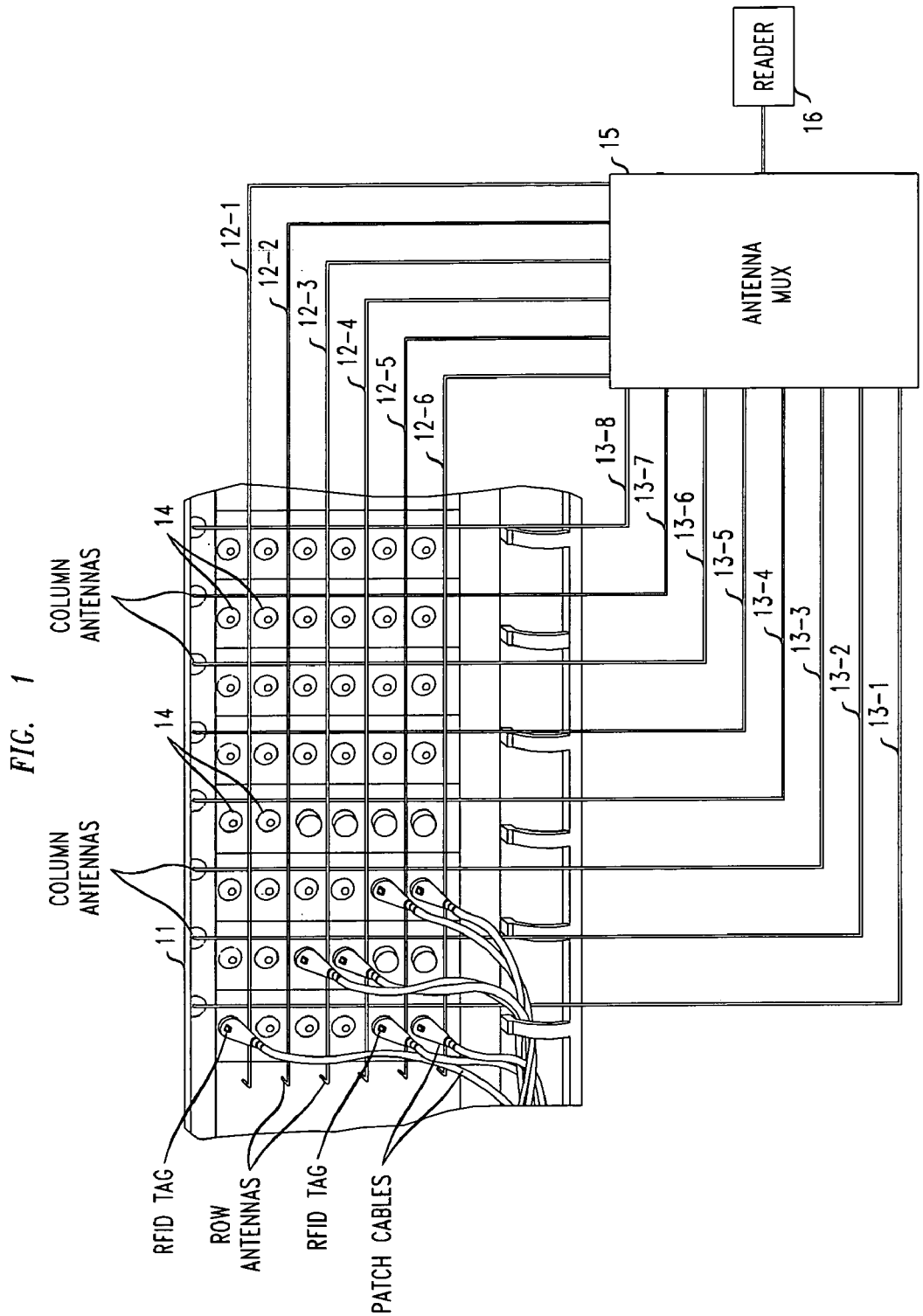
FIG. 1 shows an example of an apparatus for the automatic determination of network cable connections in accordance with an illustrative embodiment of the present invention.

In accordance with one illustrative embodiment of the present invention, RFID techniques are advantageously employed to automatically determine the connection between one or more network cables and a plurality of device ports on a patch panel of a given piece of equipment. Illustratively, the given piece of equipment may comprise a telecommunications switch and the cables may comprise telecommunications network cables.

More specifically, in accordance with the (preferred) illustrative embodiment of the invention, each of the network cables which may be connected to one of the device ports is advantageously marked—preferably at each end thereof—with an RFID device (i.e., an RFID "tag"). In particular, each end of each cable comprises an RFID tag having a unique ID value. As is well known to those of ordinary skill in the art, each RFID tag in an RFID system has a typically unique identification code (referred to herein as an "ID value") so that its presence near an RFID sensing device (i.e., an RFID antenna) can not only detect its presence but more particularly (uniquely) identify it. In addition, in accordance with the illustrative embodiment of the present invention, one end of each cable advantageously is assigned a unique even number as its ID value, while the other end of the same cable has the same number plus one assigned as its (unique) ID value.

Then, in accordance with the illustrative embodiment of the present invention, a patch panel having a plurality of device ports—preferably arranged in a rectangular configuration, as is common—is equipped with an array of RFID antennas organized so that a single antenna can support (i.e., is in the immediate vicinity of) either a single entire row or a single entire column of device ports (i.e., the possible locations of connected cable ends). In this manner, any one particular device port may be advantageously associated with a particular combination of (at least one) "row" antenna and (at least one) "column" antenna.

In accordance with the illustrative embodiment of the invention, the antennas may further be advantageously multiplexed such that a single receiver can handle the operation of all of the antennas. Specifically, the mode of operation of the illustrative embodiment of the invention may, for example, proceed as follows:

First, one of the column antennas is selected and pulsed to read the ID value of each RFID device in the immediate vicinity of the given antenna. This operation advantageously provides a set of ID values for cable ends that are connected to device ports in the column of device ports associated with (i.e., in the immediate vicinity of) the given column antenna. This operation is then advantageously repeated for each column antenna on the device (i.e., the patch panel).

Next, the same set of operations is advantageously repeated for each row antenna, thereby providing a set of ID values for cable ends that are connected to device ports in the row of device ports associated with (i.e., in the immediate vicinity of) the given row antenna. Therefore, in accordance with the principles of the present invention, it can then be advantageously determined which cable ends are connected to which device ports by matching the ID values obtained for the various column antennas with the ID values obtained for the various row antennas. In other words, if a given ID value has been read as being in the immediate vicinity of a particular column antenna associated with a given column "i" of a rectangular grid of device ports, and the same ID value has been read as being in the immediate vicinity of a particular row antenna associate with a given row "j" of the rectangular grid of device ports, then it can be deduced that the cable end having an attached RFID tag with the given ID value is in fact connected to the device port located at column "i", row "j" of the rectangular grid of device ports.

In particular, and in accordance with one illustrative embodiment of the present invention, a database lookup may be advantageously performed to determine the specific identity of a cable end having attached thereto an identified RFID tag having a given associated ID value. This may then, for example, further be used in connection with other determined cable-to-device port connections, to determine which device ports on a given piece of equipment (e.g., a patch panel) are connected (by means of a cable) to which other device ports on either the same piece of equipment or on a different piece of equipment. Specifically, the database may be advantageously populated with the information necessary to associate the opposing ends of a given cable with one another (by way of the ID values assigned to the attached RFID tags).

In accordance with one illustrative embodiment of the present invention, it can also be easily determined (e.g., without requiring a database lookup) that a given pair of device ports are in fact connected to each other (by means of a cable). In particular, if, as described above, one end of each cable has been assigned a unique even number as its ID value, while the other end of the corresponding cable has been assigned the same number plus one as its (unique) ID value, then by "masking off" the least significant bit of the ID values which have been determined to be connected to various device ports (i.e., subtracting one from the value if and only if the value is odd), and by then testing each pair of such "masked off" values for equality, it can be easily determined which device ports are connected to each other without requiring a database access to associate the opposing ends of a given cable with one another.

FIG. 1 shows an example of an apparatus for the automatic determination of network cable connections in accordance with an illustrative embodiment of the present invention. The illustrative apparatus comprises patch panel 11 which comprises a plurality of device ports 14 which are arranged in a rectangular configuration. As such, each device port can be identified in terms of a physical column (e.g., horizontal position) number—for example, being numbered from left to right by consecutive integers beginning with one—and a physical row (e.g., vertical position) number—for example, being numbered from top to bottom by consecutive integers beginning with one. As can be seen from the figure, the particular illustrative patch panel shown has 48 device ports, arranged in 8 (vertical) columns (numbered from left to right as 1 to 8) and 6 (horizontal) rows (numbered from top to bottom as 1 to 6).

In accordance with the principles of the present invention, the illustrative apparatus of FIG. 1 further comprises a plurality of vertically oriented column antennas—column antennas 13-1 through 13-8—and a plurality of horizontally oriented row antennas—row antennas 12-1 through 12-6—arranged so that each column antenna is in physical proximity to each of the device ports in a corresponding column and each row antenna is in physical proximity to each of the device ports in a corresponding row. In this manner, the presence of an RFID tag on a cable end which is connected to a given device port—such as, for example, the device port physically located in a column "i" and in a row "j"—may be advantageously sensed both by the column antenna associated with the corresponding column (i.e., column "i") and by the row antenna associated with the corresponding row (i.e., row "j"). Illustratively, each of the column antennas and each of the row antennas may comprise a strip of copper or any other material which can operate as an RFID sensing antenna. Such materials and possible antenna designs are fully conventional and will be well known to those of ordinary skill in the art.

Preferably, column antennas associated with columns other than the one in which a given device port is located, and row antennas associated with rows other than the one in which the given device port is located, will not sense an RFID tag attached to a cable end which is connected to the given device port. As will be obvious to those skilled in the art, such an appropriate level of sensitivity may be advantageously ensured by appropriately setting the power and frequency of the antenna pulsing process (i.e., the antenna reads), in order to control the sensing range of the RFID tags. Such adjustments are fully conventional and are well known by those of ordinary skill in the RFID art.

In another illustrative embodiment of the present invention however, antennas are placed (approximately midway, for example) between the columns and the rows of device ports, as well as having one additional column antenna to the left of the leftmost column of device ports, one additional column antenna to the right of the rightmost column of device ports, one additional row antenna above the topmost row of device ports, and one additional row antenna below the bottommost row of device ports. In such an illustrative embodiment of the invention, the presence of an RFID tag in a cable end connected to a given device port may be advantageously detected based on its having been sensed by both of the two column antennas which surround the column of the given device port and/or both of the two row antennas which surround the row of the given device port. In this manner, the sensitivity of the RFID antenna sensing process advantageously does not need to be controlled as accurately as it might have to be in the case of the illustrative embodiment of the present invention explicitly shown in FIG. 1.

Returning to the discussion of the illustrative embodiment of the present invention shown in FIG. 1, all of the column antennas 13-1 through 13-8 and all of the row antennas 12-1 through 12-6 are advantageously connected (electrically) to antenna multiplexer 15, which is in turn connected to RFID reader 16. Each of these devices is fully conventional and well known to those of ordinary skill in the art. Specifically, as described above, antenna multiplexer 15 advantageously cycles through each column antenna and through each row antenna in turn (under the control of reader 16), so that the set of ID values associated with RFID tags attached to cable ends that are connected to the various device ports can be identified for each column and each row of the patch panel.

Finally, in accordance with one illustrative embodiment of the present invention, a conventional access interface, such as, for example, a telecommunications network or Internet connection, may be advantageously provided to RFID reader 16. In this manner, the configuration information for the device (e.g., the identity of which identified cable ends are connected to which device ports and/or information regarding which device port pairs are connected to one another) may be advantageously accessed at a remote location without having the need to send a technician to the field (where the equipment is located).

Figure 2:
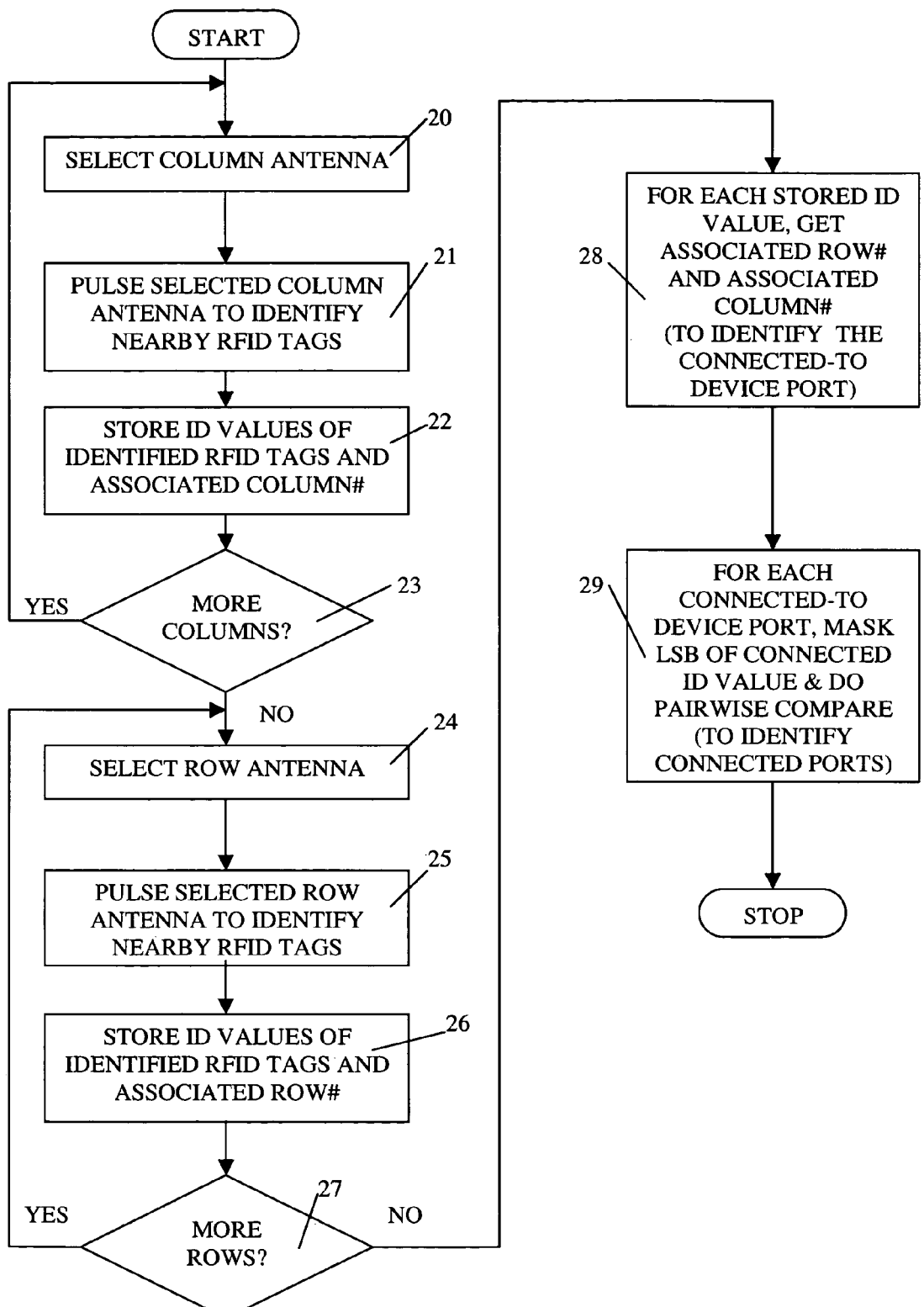
FIG. 2 shows a flowchart of a sample method for the automatic determination of network cable connections in accordance with an illustrative embodiment of the present invention.

FIG. 2 shows a flowchart of a sample method for the automatic determination of network cable connections in accordance with an illustrative embodiment of the present invention. In flowchart block 20, one of the column antennas is selected (e.g., with use of antenna multiplexer 15 of the illustrative embodiment of the invention shown in FIG. 1). Then, in block 21, the selected column antenna is pulsed (e.g., under control of RFID reader 16 of the illustrative embodiment of the invention shown in FIG. 1) in order to identify RFID tags (presumably attached to corresponding cable ends) which are in close proximity to the selected column antenna and therefore may be assumed to be connected to one of the device ports in the given column. Next, in block 22, the ID values associated with the identified RFID tags (i.e., those in close proximity to the selected column antenna) are stored along with the associated column number ("column#") of the selected column antenna. This process (i.e., as performed in blocks 20–22) is repeated for each column antenna until it is determined by decision block 23 that all column antennas have been processed.

Once all of the column antennas have been processed, flowchart block 24 selects one of the column antennas (e.g., with use of antenna multiplexer 15 of the illustrative embodiment of the invention shown in FIG. 1). Then, in block 25, the selected row antenna is pulsed (e.g., under control of RFID reader 16 of the illustrative embodiment of the invention shown in FIG. 1) in order to identify RFID tags (presumably attached to corresponding cable ends) which are in close proximity to the selected row antenna and therefore may be assumed to be connected to one of the device ports in the given row. Next, in block 26, the ID values associated with the identified RFID tags (i.e., those in close proximity to the selected row antenna) are stored along with the associated row number ("row#") of the selected row antenna. This process (i.e., as performed in blocks 24–26) is repeated for each row antenna until it is determined by decision block 27 that all row antennas have been processed.

Once all column antennas and all row antennas have been processed, block 28 of the flowchart examines the data which has been stored (in blocks 22 and 26) to find the associated row number and column number of each identified RFID tag (i.e., associated with each stored ID value). This identifies (by row number and column number) the connected-to device port. (The cable end to which is attached the RFID tag having the associated ID value is the cable end which is connected to the identified device port.) In one illustrative embodiment of the present invention, a database comprising information relating cable identities to associated RFID tag ID values may then be consulted to characterize the connection to the given device port.

And finally, in accordance with one illustrative embodiment of the present invention and as shown in block 29 of the flowchart of FIG. 2, for each connected-to device port, the least significant bit (LSB) of the ID value of the RFID tag connected thereto is masked. Then, by performing a pair-wise comparison between these masked values, it can be easily determined (e.g., without a database lookup) which pairs of device ports are connected to one another.

Addendum to the Detailed Description

It should be noted that all of the preceding discussion merely illustrates the general principles of the invention. It will be appreciated that those skilled in the art will be able to devise various other arrangements, which, although not explicitly described or shown herein, embody the principles of the invention, and are included within its spirit and scope. Furthermore, all examples and conditional language recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. It is also intended that such equivalents include both currently known equivalents as well as equivalents developed in the future—i.e., any elements developed that perform the same function, regardless of structure.

Thus, for example, it will be appreciated by those skilled in the art that any flow charts, flow diagrams, state transition diagrams, pseudocode, and the like represent various processes which may be substantially represented in computer readable medium and so executed by a computer or processor, whether or not such computer or processor is explicitly shown. Thus, the blocks shown, for example, in such flowcharts may be understood as potentially representing physical elements, which may, for example, be expressed in the instant claims as means for specifying particular functions such as are described in the flowchart blocks. Moreover, such flowchart blocks may also be understood as representing physical signals or stored physical data, which may, for example, be comprised in such aforementioned computer readable medium such as disc or semiconductor storage devices.

I claim:

1. An apparatus for determining connectivity between one or more device ports thereof and one or more cable ends having corresponding RFID tags attached thereto, the apparatus comprising:
    means for sensing, with use of a first one of a plurality of RFID antennas, said first RFID antenna being in close physical proximity to each of two or more of said plurality of device ports, whether one or more of said RFID tags attached to said cable ends is in close physical proximity to said first RFID antenna; and
    means for detecting a connection between one of said plurality of device ports which is in close physical proximity to said first RFID antenna and a cable end having a corresponding RFID tag attached thereto based on said means for sensing with use of said first RFID antenna having determined that said corresponding RFID tag attached to said cable end is in close physical proximity to said first RFID antenna,
    wherein one or more of said plurality of device ports is in close physical proximity to each of at least two of said plurality of RFID antennas, at least one of said plurality of device ports which is in close physical proximity to each of at least two or said plurality of RFID antennas being one of said device ports having one of said cable ends connected thereto,
    wherein each of said plurality of RFID antennas is in said close physical proximity to each of two or more of said plurality of device ports and wherein each of said plurality of device ports is in said close physical proximity to each of at least two of said plurality of RFID antennas,
    wherein the plurality of device ports are arranged in a substantially rectangular arrangement comprising a plural number of columns of device ports and a plural number of rows of device ports,
    wherein said plurality of RFID antennas comprises a number of column antennas equal to the number of columns of device ports and a number of row antennas equal to the number of rows of device ports, and
    wherein each column antenna is in said close physical proximity to each of the plurality of device ports in a corresponding one of said columns of device ports and each row antenna is in said close physical proximity to each of the plurality of device ports in a corresponding one of said rows of device ports.

2. The apparatus of claim 1 further comprising an antenna multiplexer for selecting one of said plurality of RFID antennas at a time for sensing RFID information, each of said plurality of RFID antennas being connected to said antenna multiplexer.

3. The apparatus of claim 2 further comprising an RFID reader connected to said antenna multiplexer, said RFID reader for reading said RFID information received based on said sensing of said RFID antennas.

4. The apparatus of claim 1 further comprising:
    means for selecting two or more of said RFID antennas in turn for sensing corresponding RFID information; and
    means for determining that a cable end is connected to one of said device ports based on said sensed RFID information corresponding to at least two of said RFID antennas.

5. The apparatus of claim 4 further comprising means for communicating across a network said determination that said cable end is connected to said one of said device ports.

6. An apparatus for determining connectivity between one or more device ports thereof and one or more cable ends having corresponding RFID tags attached thereto, the apparatus comprising:
    means for sensing, with use of a first one of a plurality of RFID antennas, said first RFID antenna being in close physical proximity to each of two or more of said plurality of device ports, whether one or more of said RFID tags attached to said cable ends is in close physical proximity to said first RFID antenna; and
    means for detecting a connection between one of said plurality of device ports which is in close physical proximity to said first RFID antenna and a cable end having a corresponding RFID tag attached thereto based on said means for sensing with use of said first RFID antenna having determined that said corresponding RFID tag attached to said cable end is in close physical proximity to said first RFID antenna,
    wherein one or more of said plurality of device ports is in close physical proximity to each of at least two of said plurality of RFID antennas, at least one of said plurality of device ports which is in close physical proximity to each of at least two or said plurality of RFID antennas being one of said device ports having one of said cable ends connected thereto,
    wherein each of said plurality of RFID antennas is in said close physical proximity to each of two or more of said plurality of device ports and wherein each of said plurality of device ports is in said close physical proximity to each of at least two of said plurality of RFID antennas, wherein the plurality of device ports are arranged in a substantially rectangular arrangement comprising a plural number of columns of device ports and a plural number of rows of device ports, wherein said plurality of RFID antennas comprises a number of column antennas equal to at least one more than the number of columns of device ports and a number of row antennas equal to at least one more than the number of rows of device ports, and wherein each column of device ports is in said close physical proximity to a corresponding adjacent pair of two of said column antennas and each row of device ports is in said close physical proximity to a corresponding adjacent pair of two of said row antennas.

7. The apparatus of claim 6 further comprising an antenna multiplexer for selecting one of said plurality of RFID antennas at a time for sensing RFID information, each of said plurality of RFID antennas being connected to said antenna multiplexer.

8. The apparatus of claim 7 further comprising an RFID reader connected to said antenna multiplexer, said RFID reader for reading said RFID information received based on said sensing of said RFID antennas.

9. The apparatus of claim 6 further comprising:
means for selecting two or more of said RFID antennas in turn for sensing corresponding RFID information; and
means for determining that a cable end is connected to one of said device ports based on said sensed RFID information corresponding to at least two of said RFID antennas.

10. The apparatus of claim 9 further comprising means for communicating across a network said determination that said cable end is connected to said one of said device ports.

11. A method for determining connectivity between one or more of a plurality of device ports and one or more cable ends having corresponding RFID tags attached thereto, the method comprising the steps of:
sensing, with use of a first one of a plurality of RFID antennas, said first RFID antenna being in close physical proximity to each of two or more of said plurality of device ports, whether one or more of said RFID tags attached to said cable ends is in close physical proximity to said first RFID antenna; and
detecting a connection between one of said plurality of device ports which is in close physical proximity to said first RFID antenna and a cable end having a corresponding RFID tag attached thereto based on said step of sensing with use of said first RFID antenna having determined that said corresponding RFID tag attached to said cable end is in close physical proximity to said first RFID antenna,
wherein at least one of said plurality of device ports which is in close physical proximity to said first RFID antenna is also in close proximity to a second one of said plurality of said RFID antennas, the method further comprising the step of
sensing, with use of said second RFID antenna, whether one or more of said RFID tags attached to said cable ends is in close physical proximity to said second RFID antenna,
and wherein the step of detecting the connection between one of said plurality of device ports and the cable end having the corresponding RFID tag attached thereto comprises
(i) determining that said step of sensing with use of said first RFID antenna determined that one of said RFID tags attached to said cable ends is in close physical proximity to said first RFID antenna, and
(ii) determining that said step of sensing with use of said second RFID antenna also determined that said one of said RFID tags attached to said cable ends is in close physical proximity to said second RFID antenna.

12. The method of claim 11 wherein each of said plurality of RFID antennas is in said close physical proximity to each of two or more of said plurality of device ports and wherein each of said plurality of device ports is in said close physical proximity to each of at least two of said plurality of RFID antennas, and wherein the plurality of device ports are arranged in a substantially rectangular arrangement comprising a plural number of columns of device ports and a plural number of rows of device ports.

13. The method of claim 12 wherein said plurality of RFID antennas comprises a number of column antennas equal to the number of columns of device ports and a number of row antennas equal to the number of rows of device ports,
wherein each column antenna is in said close physical proximity to each of the plurality of device ports in a corresponding one of said columns of device ports and each row antenna is in said close physical proximity to each of the plurality of device ports in a corresponding one of said rows of device ports,
and wherein said first RFID antenna comprises one of said column antennas and said second RFID antenna comprises one of said row antennas.

14. The method of claim 12 wherein said plurality of RFID antennas comprises a number of column antennas equal to at least one more than the number of columns of device ports and a number of row antennas equal to at least one more than the number of rows of device ports,
wherein each column of device ports is in said close physical proximity to a corresponding adjacent pair of two of said column antennas and each row of device ports is in said close physical proximity to a corresponding adjacent pair of two of said row antennas,
and wherein said first RFID antenna comprises one of said column antennas, said first RFID antenna in close physical proximity to a given column of device ports, and said second RFID antenna comprises one of said number of row antennas, said second RFID antenna in close physical proximity to a given row of device ports,
the method further comprising the steps of:
sensing, with use of a third one of said plurality of RFID antennas, said third RFID antenna comprising one of said column antennas, said third RFID antenna being in close physical proximity to said given column of device ports to which said first RFID antenna is also in close physical proximity, whether one or more of said RFID tags attached to said cable ends which is in close physical proximity to said first RFID antenna is also in close physical proximity to said third RFID antenna, and
sensing, with use of a fourth one of said plurality of RFID antennas, said fourth RFID antenna comprising one of said number of row antennas, said fourth RFID antenna being in close physical proximity to said given row of device ports to which said second RFID antenna is also in close physical proximity, whether one or more of said RFID tags attached to said cable ends which is in close physical proximity to said second RFID antenna is also in close physical proximity to said fourth RFID antenna, and wherein the step of detecting the connection between one of said plurality of device ports and the cable end having a corresponding RFID tag attached thereto comprises
  (i) said steps of sensing with use of said first and third RFID antennas having each determined that one of said RFID tags attached to said cable ends is in close physical proximity to both said first and third RFID antennas, and
  (ii) said steps of sensing with use of said second and fourth RFID antennas having determined that said one of said RFID tags attached to said cable ends is in close physical proximity to both said second and fourth RFID antennas,
  said one of said plurality of device ports being located in said given column of device ports and in said given row of device ports.

15. The method of claim 11 further comprising the step of
  storing a first set of one or more ID values of said one or more of said RFID tags attached to said cable ends which are in close physical proximity to said first RFID antenna,
  storing a second set of one or more ID values of said one or more of said RFID tags attached to said cable ends which are in close physical proximity to said second RFID antenna,
  and wherein the step of detecting the connection between one of said plurality of device ports and the cable end having the corresponding RFID tag attached thereto further comprises comparing the first set of stored ID values with the second set of stored ID values to identify one or more ID values in both the first and second sets.

16. The method of claim 11 further comprising the step of selecting said first RFID antenna with the use of an antenna multiplexer which selects one of said plurality of RFID antennas at a time for sensing RFID information, each of said plurality of RFID antennas being connected to said antenna multiplexer.

17. The method of claim 16 wherein said step of sensing with use of said first RFID antenna is performed with use of an RFID reader connected to said antenna multiplexer, wherein the RFID reader reads said RFID information received from sensing an RFID antenna.

18. The method of claim 11 further comprising means for communicating across a network said detecting of a connection between said one of said plurality of device ports which is in close physical proximity to said first RFID antenna and said cable end having said corresponding RFID tag attached thereto.

19. The method of claim 11 wherein the step of detecting a connection between one of said plurality of device ports which is in close physical proximity to said first RFID antenna and a cable end having a corresponding RFID tag attached thereto detects a first connection between a first device port and a first cable end having a first RFID tag attached thereto,
  the method further comprising the steps of:
  detecting a second connection between a second device port and a second cable end having a second RFID tag attached thereto; and
  determining that said first device port is connected to said second device port based on a determination that the first cable end and the second cable end are opposing ends of a common cable.

20. A method for determining connectivity between one or more of a plurality of device ports and one or more cable ends having corresponding RFID tags attached thereto, the method comprising the steps of:
  sensing, with use of a first one of a plurality of RFID antennas, said first RFID antenna being in close physical proximity to each of two or more of said plurality of device ports, whether one or more of said RFID tags attached to said cable ends is in close physical proximity to said first RFID antenna; and
  detecting a connection between one of said plurality of device ports which is in close physical proximity to said first RFID antenna and a cable end having a corresponding RFID tag attached thereto based on said step of sensing with use of said first RFID antenna having determined that said corresponding RFID tag attached to said cable end is in close physical proximity to said first RFID antenna,
  wherein the step of detecting a connection between one of said plurality of device ports which is in close physical proximity to said first RFID antenna and a cable end having a corresponding RFID tag attached thereto detects a first connection between a first device port and a first cable end having a first RFID tag attached thereto,
  the method further comprising the steps of:
  detecting a second connection between a second device port and a second cable end having a second RFID tag attached thereto; and
  determining that said first device port is connected to said second device port based on a determination that the first cable end and the second cable end are opposing ends of a common cable,
  wherein said step of determining that said first device port is connected to said second device port comprises comparing an ID value of the first RFID tag with an ID value of the second RFID tag and determining that a previously defined relationship exists therebetween.

21. The method of claim 20 wherein said previously defined relationship comprises a difference only in the least significant bit thereof.

* * * * *